United States Patent
Krüger et al.

(10) Patent No.: US 9,817,053 B2
(45) Date of Patent: Nov. 14, 2017

(54) METHOD AND APPARATUS FOR TESTING A TRANSFORMER

(71) Applicant: OMICRON Electronics GmbH, Klaus (AT)

(72) Inventors: Michael Krüger, Altach (AT); Dmitry Atlas, Weiler (AT); Florian Predl, Götzis (AT); Markus Jäger, Dornbirn (AT); Michael Freiburg, Dortmund (DE)

(73) Assignee: OMICRON ELECTRONICS GMBH, Klaus (AT)

( * ) Notice: Subject to any disclaimer, the term of this patent is extended or adjusted under 35 U.S.C. 154(b) by 134 days.

(21) Appl. No.: 14/782,183

(22) PCT Filed: Feb. 4, 2014

(86) PCT No.: PCT/EP2014/052127
§ 371 (c)(1),
(2) Date: Oct. 2, 2015

(87) PCT Pub. No.: WO2014/161681
PCT Pub. Date: Oct. 9, 2014

(65) Prior Publication Data
US 2016/0025797 A1    Jan. 28, 2016

(30) Foreign Application Priority Data

Apr. 5, 2013 (EP) .................................... 13162478

(51) Int. Cl.
*G01R 29/20* (2006.01)
*G01R 31/02* (2006.01)

(52) U.S. Cl.
CPC .................................. *G01R 31/027* (2013.01)

(58) Field of Classification Search
CPC ..... G01R 31/2827; G01R 31/013; H02H 3/20
(Continued)

(56) References Cited

U.S. PATENT DOCUMENTS 5,541,516 A * 7/1996 Rider ....................... G01V 3/08
324/326
5,635,841 A * 6/1997 Taylor ..................... F02P 17/00
324/380
(Continued)

FOREIGN PATENT DOCUMENTS

CN   102654571 A    9/2012
CN   202471950 U   10/2012
(Continued)

OTHER PUBLICATIONS

Omicron Electronics GmbH. CT Analyzer—Revolution in Current Transformer Testing and Calibration. Dec. 1, 2012. https://www.omicron.at/fileadmin/user_upload/pdf/literature/CT-Analyzer-Brochure-ENU.pdf. Downloaded on Sep. 19, 2013.
International Search Report of PCT/EP2014/052127.
"State system for ensuring the uniformity of measurements. Voltage transformers. Verification procedure" Interstate Council for Standardization, Metrology and Certification (ISC). Jan. 16, 2013.

*Primary Examiner* — Giovanni Astacio-Oquendo
(74) *Attorney, Agent, or Firm* — Seyfarth Shaw LLP; Brian Michaelis

(57) ABSTRACT

For testing a transformer (20) the transformer (20) is emulated by an equivalent circuit (30) and an accuracy of the transformer (20) relative to the equivalent circuit (30) is determined by evaluating a test response of the transformer (20) and is then automatically converted to an operating condition-related accuracy of the transformer (20).

23 Claims, 5 Drawing Sheets

(58) Field of Classification Search
USPC .................................. 324/500, 537, 549
See application file for complete search history.

(56) References Cited

U.S. PATENT DOCUMENTS

| | | | | |
|---|---|---|---|---|
| 6,005,435 | A * | 12/1999 | Saida | H04N 3/185 327/290 |
| 6,044,003 | A * | 3/2000 | Toshinari | H02M 7/537 310/318 |
| 6,069,811 | A * | 5/2000 | Moriguchi | H02H 7/1257 363/142 |
| 6,225,809 | B1 * | 5/2001 | Watano | G01N 27/60 324/464 |
| 7,106,083 | B2 | 9/2006 | Zhou | |
| 8,044,672 | B2 | 10/2011 | Williams | |
| 2004/0130329 | A1 | 7/2004 | Suss et al. | |
| 2009/0088995 | A1 | 4/2009 | Tiberg et al. | |
| 2014/0130329 | A1 | 5/2014 | Changsrivong et al. | |

FOREIGN PATENT DOCUMENTS

| | | |
|---|---|---|
| CN | 102841285 A | 12/2012 |
| EP | 1398644 A1 | 3/2004 |
| EP | 1653238 | 5/2006 |
| EP | 2466322 | 6/2012 |
| RU | 2248002 C2 | 3/2005 |

\* cited by examiner

METHOD AND APPARATUS FOR TESTING A TRANSFORMER

The present invention relates to a method and a device for testing a transformer. In particular, the invention relates to a method and a device for testing the accuracy of voltage transformers, without, however, being limited to this preferred field of application.

Voltage transformers with an inductive or capacitive operating principle are equipment of high voltage technology and a constituent of any power supply system. The inductive operating principle is substantially the principle of a single-phase transformer; the capacitive operating principle is a combination of a capacitive voltage divider, a choke coil and a single-phase transformer. Capacitive voltage transformers are used, for example, in high and very high voltage systems with very high voltages in the region of several hundred kV, the capacitive voltage divider of the voltage transformer thereby serving as the step-down transformer for converting the high voltage into a middle voltage range of several kV and supplying the transformer with that voltage.

Voltage transformers serve on the one hand to transform the operating voltages into proportional voltages which can be processed further by information technology; on the other hand, they serve the purpose of galvanically separating the high voltage and the secondary technology.

The transformed voltages of the transformers are used further for billing or protection purposes. Depending on the field of use (billing or protection), the transformers must comply with a specific accuracy class. The accuracy classes are defined for inductive transformers in standard DIN EN 60044-2 and for capacitive transformers in standard DIN EN 60044-5, these standards currently being superseded by the series of standards DIN EN 61869.

According to the standard, voltage transformers are divided into different accuracy classes according to their intended use. According to the class, the phase angles and amplitude errors of the transformation must not exceed a specific value. The transformers are in particular divided into classes which are based on their maximum permissible percentage deviation (voltage measurement error) at rated voltage and rated burden (examples of classes are: 0.1-0.2-0.5-1.0-3.0). In the case of transformers for measurement purposes, the mentioned classes must not be left at operating frequency (50 Hz or 60 Hz), rated burden (e.g. in the range from 25% to 100%) with a power factor, for example, in the range of from 0.8 to 1.0 inductive and voltages of, for example, from 80% to 120% of the rated voltage. In the case of transformers for protection purposes, the classes must be observed at operating frequency, rated burdens (from 25% to 100%) with power factor 0.8 inductive and voltages of from 5% to 190% (according to the earth fault factor) of the rated voltage. The above-mentioned classes and limit values can vary country-specifically, and values differing therefrom may also be requested by customers.

On consideration of the accuracy classes it will be seen that the voltage transformers must be high-precision measuring instruments, of which very high accuracy requirements are made both in terms of the voltage transmission ratio and in terms of the transmission angle. Inaccuracies can result in high costs due to errors in the measurement of the transmitted energy or can endanger safe operation.

In order to test the accuracy of transformers, they are currently dismantled as required, replaced by a replacement transformer and transported to a high voltage laboratory for accuracy testing. The complex measures result in high costs, long downtimes and a high outlay in terms of testing and installation. In order to compensate for the costs and outlay, testing solutions have in the past been designed which permit testing in situ at nominal voltage and thus minimise the outlay in terms of installation and transportation.

However, there is at present no method of testing the accuracy of transformers in situ without using the approximately nominal voltage of the transformers as the test voltage. The non-linearity of the equipment does not allow testing to be carried out directly at low voltages.

Methods known from the field of current transformers cannot wholly be transferred to voltage transformers because the parameters of the transformer cannot readily be determined owing to parasitic influences and its internal construction. In addition, the methods already known do not take into account the non-linear frequency-dependent behaviour of the loss dissipation of voltage transformers.

Accordingly, the object underlying the present invention is to provide an improved method and a correspondingly configured device by means of which the accuracy of transformers can be tested in situ with a low outlay, wherein the invention is to be suitable in particular for the testing of voltage transformers.

The object is achieved according to the invention by a method having the features of claim 1 and a device having the features of claim 21. The dependent claims define preferred and advantageous embodiments of the invention.

The invention proposes emulating the transformer to be tested by means of an equivalent circuit and automatically determining the equivalent-circuit-related accuracy of the transformer by evaluating a test response of the transformer generated as a result of a test signal. The equivalent-circuit-related accuracy is then likewise converted, automatically or with computer assistance, into an operating-condition-related accuracy of the transformer.

The present invention ensures independent testing of the accuracy of transformers generally, wherein the operating state of the transformer can be approximated accurately and reproducibly by way of its transmission behaviour at low test voltages.

The invention can be embodied in the form of a portable test device, so that the transformer can be tested in situ. The invention is suitable in particular for the testing of inductive or capacitive voltage transformers, but the invention can be used generally for testing the accuracy of transformers.

According to one embodiment of the invention, a measurement and calculation model is used in order to derive, from measurement results at low measuring voltages with different frequencies, information about the behaviour under an operating condition. There is used as the basis therefor an equivalent circuit configured for that operating condition, the elements of which can be determined on different variants. If all the parameters of the equivalent circuit are known, it is possible, on the basis of the equivalent circuit, to calculate the behaviour of the transformer and its accuracy in terms of amount and phase under different operating conditions based on the voltage vector diagram of the transformer.

According to a further embodiment, the invention makes it possible to determine all the necessary parameters of the transformer, the transformation ratio and the frequency-dependent linear or non-linear iron losses of the transformer with low voltages from the low voltage side of the transformer at variable frequency and with a corresponding loss interpretation and calculation model.

According to a further embodiment of the invention there is used an equivalent circuit of the transformer in which the complex and distributed primary internal capacitance is taken into consideration as a concentrated element, and a novel method for determining the primary internal capacitance and, building thereon, a method for determining the open-circuit transformation of the transformer are used.

According to a preferred embodiment of the invention, a winding correction which may have been carried out during the process of manufacturing the transformer in order to comply with the accuracy class is taken into consideration.

In further embodiments of the invention, the following features can also be implemented, individually or in combination:

In the case of capacitive voltage transformers, the accuracy of the capacitive voltage divider of the voltage transformer can additionally be tested.

There can be used a simulation model of the frequency- and flux-dependent iron losses of the transformer which reduces conventional empirical-analytical loss models by the flux density dependence to $P_{tot}=C \cdot f^x \cdot \Psi^y$, where C, $f^x$ and $\Psi^x$ describe the components dependent on the transformer as well as on the frequency f and the flux $\Psi$. In order to permit this simplification, measurements are carried out with different frequencies in each case for the same linked flux. Finally, using a model-based method, the dynamic coefficient C and the exponent x of the frequency f and the exponent y for the flux $\Psi$ can be determined. For operating the simulation model, measurements are preferably carried out at low voltages less than 10 V and variable frequency between 0 and 50 Hz.

The concentrated primary internal capacitance of the equivalent circuit can be determined on the basis of reference measurements with a precisely known reference capacitance. To that end, a low-level signal with variable frequency is applied to the voltage transformer on the secondary side, in order to find the first parallel resonance. By means of a reference capacitance, which is added, this resonance frequency is then deliberately detuned in order to determine, with knowledge of the reference capacitance and the newly adjusted resonance, the primary internal capacitance. This method is performed only in the case of inductive voltage transformers, because the internal capacitance in the case of the inductive transformers used in capacitive voltage transformers is negligible for the frequency range around 50 Hz.

The winding resistances of the equivalent circuit can be determined with d.c. voltage signals.

The sum of the leakage inductances of the equivalent circuit can be determined on the basis of the calculated primary internal capacitance or on the basis of a measured short-circuit reactance. In the case of transformers with one winding, the leakage inductances can be assumed to be divided according to empirically determined values. In the case of transformers with a plurality of windings, the leakage inductances related to the side in question can be determined on the basis of mutual measurements of the individual windings.

In general, the invention permits complete information about the accuracy of the transformer without fingerprints and knowledge of the materials used and, on the basis of the series of standards DIN EN 60044, or currently DIN EN 61869, allows a variable burden with different power factors and different operating voltages to be taken into consideration.

The invention will be explained in greater detail below by means of the accompanying drawing and with reference to preferred embodiments.

The invention will be explained hereinbelow with reference to a capacitively coupled voltage transformer. However, the invention is not limited to this use but can also be applied to inductive voltage transformers as well as to transformers in general.

Figure 1:
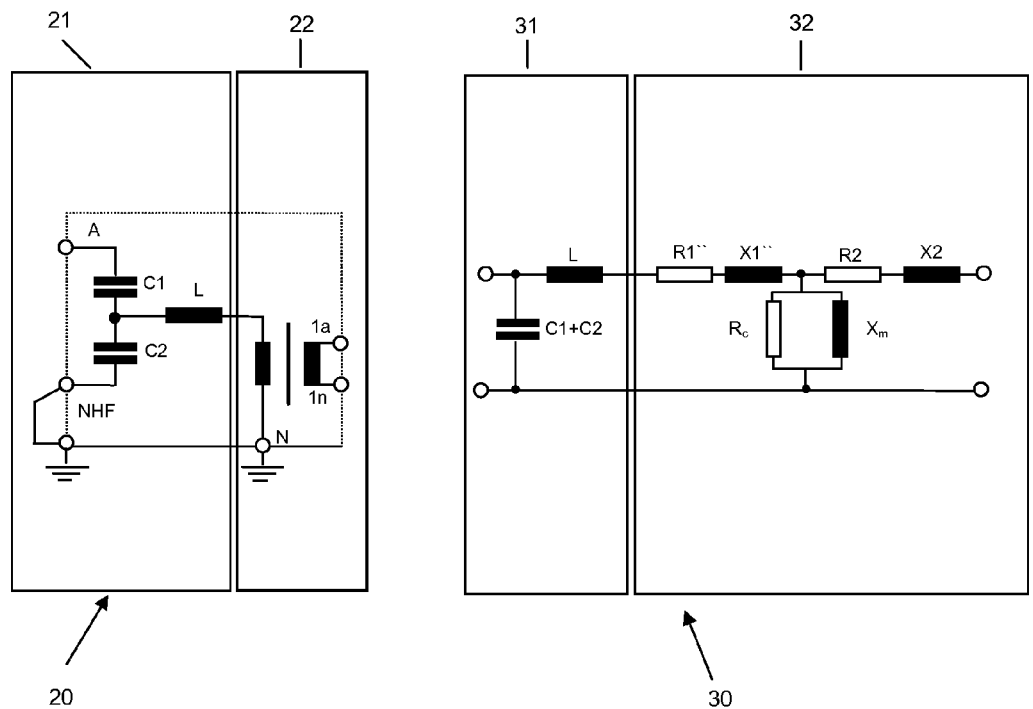
FIG. 1 shows the structure of a transformer in the form of a capacitively coupled voltage transformer, and a corresponding equivalent circuit.

FIG. 1 shows the structure of such a capacitively coupled voltage transformer 20, wherein the voltage transformer 20 comprises a coupling section 21 with coupling capacitances C1 and C2, which form a capacitive voltage divider, and a choke coil L adjusted to the capacitances C1 and C2 as well as an (inductive) transformer section 22 with a single-phase transformer. The connections of the voltage transformer 20 on the primary side are denoted A or NHF, while the connections on the secondary side are denoted 1a and 1n. For the sake of clarity, FIG. 1 shows a voltage transformer with only one secondary winding.

Within the context of the present invention, the voltage transformer is emulated by an equivalent circuit, it being possible for the equivalent circuit to be related to either the primary side or the secondary side of the voltage converter.

Such an equivalent circuit 30 is likewise shown by way of example in FIG. 1, a section 31 of the equivalent circuit being assigned to the coupling section 21 of the voltage transformer 20, while a section 32 of the equivalent circuit corresponds to the transformer section 22 of the voltage transformer 20.

Figure 2:
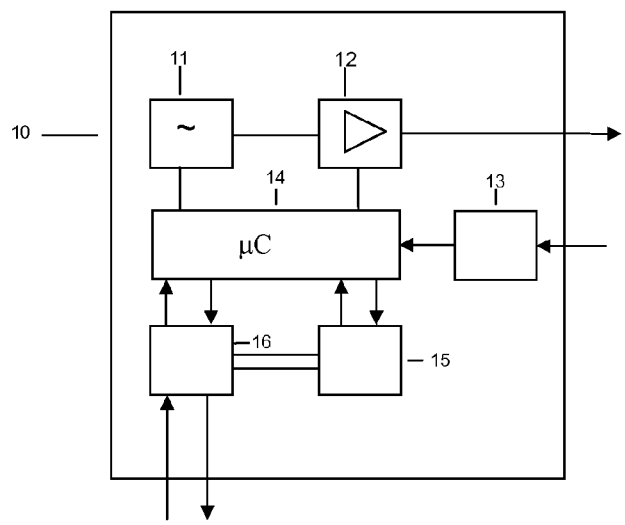
FIG. 2 shows a simplified schematic block diagram of a test device for testing a transformer according to an embodiment of the invention.

FIG. 2 shows a block diagram of a test device 10 according to an embodiment of the invention which, on the basis of such an equivalent circuit, tests the accuracy of the voltage transformer by means of automatic operations and to that end, by applying a sum of test signals and carrying out different measurements, which will be described in greater detail below, determines the individual components or parameters of the equivalent circuit and then, on the basis thereof, first determines the accuracy of the voltage transformer relative to the equivalent circuit and converts the equivalent-circuit-related accuracy into an operating-condition-related accuracy.

The test device 10 shown schematically in FIG. 2 comprises a signal source 11 for generating a test or measuring signal of specific amplitude and frequency, as well as a controllable amplifier 12, via which the test signal amplified as desired is emitted to the object under test. The test device can have separate outputs for a low-voltage test on the one hand and a high-voltage test on the other hand. The signal source 11 and the controllable amplifier 12 are driven by a control unit 14, which can be in the form of a microcontroller or digital signal processor. The test response which then appears at the test object or object under test is detected by a measuring or detection device 13 and fed to the control unit 14, which evaluates the test response and, in dependence thereon, initiates further actions.

The control unit 14 is the central component of the test device 10 and is responsible for the largely automatic execution of the test method described hereinbelow with reference to a preferred embodiment. As is shown in FIG. 2, the test device 10 has a memory 15 for storing operating or control programs for the control unit 14 or for storing test results, etc. By way of an input/output section 16, commands or control information can be fed to the test device 10 or test results or control information for other devices can be outputted. The input/output section can comprise, for example, a keyboard, a display and various types of interfaces (USB, D-Sub 9, flash card slots, etc.). The test device can likewise have an equipotential bonding conductor connection.

The test device 10 is preferably in the form of a compact portable device so that, by means of the device, a transformer can be tested in situ in a simple manner. As will be explained in greater detail below, for carrying out certain measurements the test device 10 can be coupled with a voltage booster which amplifies the test voltage supplied by the test device to a desired high voltage value and applies it to the test object.

The control unit 14 of the test device 10 is so configured that, by means of a plurality of measurements which are performed automatically, it determines the individual components of the equivalent circuit shown by way of example in FIG. 1 and, on the basis of the equivalent circuit thus known, determines the equivalent-circuit-related accuracy of the voltage transformer. The connection of the test device 10 to the voltage transformer 20 can be made according to a four-wire measuring method, wherein the voltage applied directly to the test object is measured back in order to avoid the measurement being influenced by cables or transfer resistances at the terminals.

The equivalent-circuit-related accuracy is then converted by the control unit 14 into an operating-condition-related accuracy in order to allow the voltage transformer to be evaluated both as regards amplitude accuracy and as regards phase accuracy.

According to one embodiment of the invention, in order to determine the components of the equivalent circuit, the following measurements, which will be discussed in greater detail below, are carried out in particular: Primary and secondary short-circuit impedance measurements, measurement of the resistance of the secondary windings of the voltage transformer, measurement of the magnetisation behaviour of the voltage transformer, measurement of the transformation ratio of the voltage transformer.

The DC winding resistance is determined for each secondary winding of the voltage transformer 20, so that information about the respective secondary winding resistance R2 of the equivalent circuit 30 is known from the test response of the voltage transformer 20 (see FIG. 1). The measurement is preferably carried out in sequence from the highest winding to the lowest winding, in order to reduce the outlay in terms of wiring. The transformed primary winding resistance R1" of the equivalent circuit 30 can be calculated from stray losses which are likewise measured and from the DC secondary resistance values.

The short-circuit impedance measurements can be carried out by the test device 10 both on the primary side and on the secondary side.

In the case of short-circuit impedance measurement on the primary side, the input terminals A and NHF of the voltage transformer 20 are short-circuited and set at earth potential, and a test signal is applied to the voltage transformer in order to detect the test response at each secondary winding in succession and, on the basis of the test response of the voltage transformer 20, to be able to determine the stray losses already mentioned above. If a plurality of secondary windings are present, this measurement is carried out separately for each secondary winding.

The short-circuit impedance measurement on the secondary side is carried out for only one secondary winding, that is to say, for example, only the second secondary winding 2a-2n of the voltage transformer 20 is short-circuited and the short-circuit impedance at the first secondary winding 1a-1n is measured (if the voltage transformer has only one secondary winding, a short-circuit impedance measurement on the secondary side is not required).

Overall, this allows the transformed primary leakage inductance X1" and the secondary leakage inductance X2 to be determined separately for each secondary winding for the equivalent circuit shown in FIG. 1.

The measurement of the magnetisation behaviour of the voltage transformer must be carried out per se only for one secondary winding, for example for the innermost secondary winding 1a-1n, since the iron core of the voltage transformer is the same for all the secondary windings and the stray losses of this secondary winding are known, in order to be able to calculate the EMF voltage accordingly. Nevertheless, a plurality of such measurements may also be carried out.

The measurement of the transformation ratio of the voltage transformer 20 is carried out by the test device 10 in order to determine the actual coil or winding ratio of the voltage transformer 20 and thereby in particular take into consideration a winding correction carried out during the manufacturing process.

A voltage transformer is in principle calculated at the manufacturer's in the development process before the voltage transformer goes into production. This calculation is made on the basis of "constant" base values of the materials to be used and in most cases also taking into consideration the tolerances in the manufacturing process. The accuracy of the finished product is ultimately influenced both by the tolerances of the materials used and by the tolerances of the manufacturing processes. Therefore, during the manufacturing process, a control measurement is usually carried out, after the application of the coils and before the insulation, in order to determine whether the voltage transformer is situated within the usual working range. If there are deviations, the voltage transformer is "adjusted" to the desired range by changing the number of windings. Owing to this winding correction, the pure winding transformation ratio of the voltage transformer then no longer agrees with the nominal voltage transformation ratio.

As has already been discussed above, the test device 10 generally detects the losses of the voltage transformer 20 that is to be tested, in order to determine or calculate the "accuracy" thereof. These losses must accordingly also include such a winding correction performed during the process of manufacturing the voltage transformer 20, in order that the absolute accuracy of the voltage transformer 20 can be determined. For this reason, the test device 10 is configured to carry out a measurement of the transformation ratio of the voltage transformer 20, a test voltage to that end being applied to the primary side of the voltage transformer 20 to be tested.

In order to measure the transformation, it is important that this is carried out with a voltage that is not too low compared with the primary nominal voltage of the test object. Voltages of approximately from 3% to 80% of the nominal voltage have been found to be suitable.

Because the test device 10 operates at low voltages, preferably of the order of magnitude of not more than 10 V or 40 V effective value, for carrying out the other measurements described above, and the voltage source 11 of the test device 10 is consequently configured for lower voltages, the use of a corresponding amplifier arrangement in the form of a voltage booster is required for carrying out the transformation ratio measurement. Such an amplifier arrangement can also be integrated into the test device 10, although this would increase the weight and size of the test device accordingly. The use of a separate amplifier arrangement can also be advantageous for safety reasons owing to the high voltages that occur. If different voltage variants are required, it can likewise be advantageous to work with different components.

Figure 3:
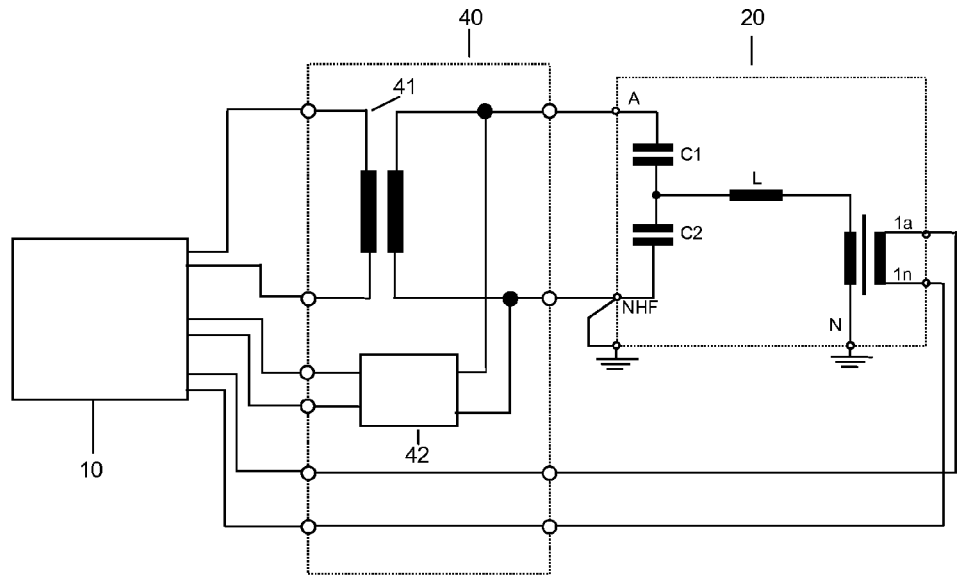
FIG. 3 shows an example of the coupling and connection of the test device to the capacitively coupled voltage transformer shown in FIG. 1 for testing the voltage transformer, in particular for testing the total transformation ratio of the voltage transformer.

An example of the connection of the test device 10 to a voltage booster 40 and the voltage transformer 20 shown in FIG. 1 is shown in FIG. 3.

Test signal outputs of the test device 10 are coupled with the primary side of a transformer 41 of the voltage booster 40, while primary and secondary test response measuring inputs of the test device 10 are coupled via a voltage divider 42 with the secondary side of the transformer 41 and the primary side of the voltage transformer 20 or with the secondary side of the voltage transformer 20. The test device is connected to the voltage transformer according to a four-wire measuring method, wherein the voltage applied directly to the test object is measured back in order to avoid the measurement being influenced by cables or transfer resistances at the terminals.

By means of the arrangement shown in FIG. 3, the total transformation ratio of the voltage transformer 20 can be measured. The terminals NHF and N of the voltage transformer 20 are connected to earth. The high test voltage supplied by the voltage booster 40 is applied between the terminals A and NHF and thus between A and earth. The low-voltage measurement input of the test device 10 is connected to the secondary winding 1a-1n of the voltage transformer 20.

Even in the presence of a plurality of secondary coils, the measurement of the total transformation ratio of the voltage transformer 20 with the arrangement shown in FIG. 3 is preferably carried out only once for the first secondary winding 1a-1n. In addition, the measurement of the total transformation ratio is carried out only for capacitively coupled voltage transformers, while this test can be omitted in the case of inductive voltage transformers. As the result of this measurement, the total transformation ratio is determined in the form of the ratio of the voltage at the terminals A and NHF to the voltage at the secondary winding 1a-1n of the voltage transformer 20.

Figure 4:
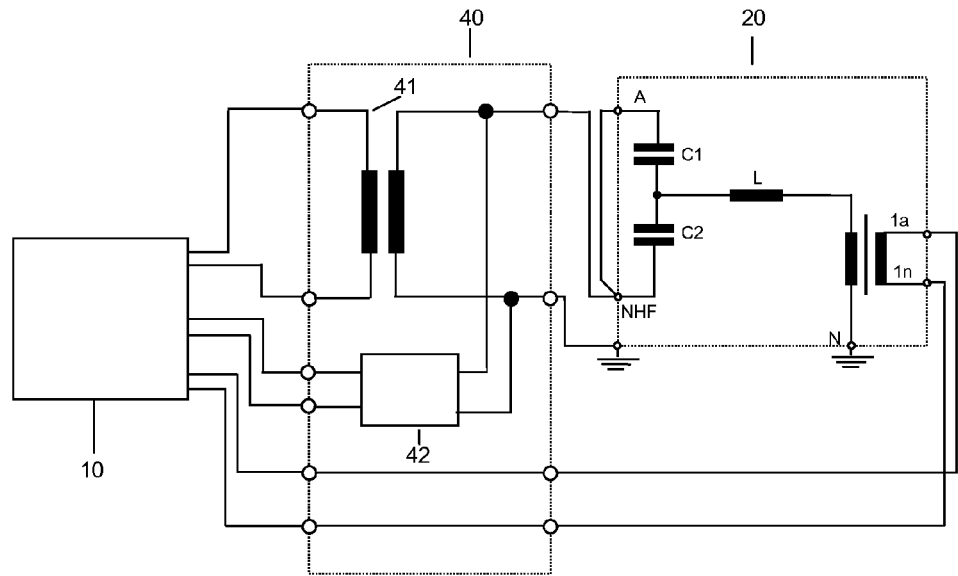
FIG. 4 shows an example of the connection of the test device to the voltage transformer of FIG. 1 for testing the transformation ratio of the inductive voltage transformer section of the transformer and for testing the capacitive voltage divider of the transformer.

With a slightly modified test arrangement, which is shown in FIG. 4, the transformation of the inductive voltage transformer section of the voltage transformer 20 can be determined. The purpose of this measurement is in particular to be able to distinguish between capacitive transformation ratio and inductive transformation ratio.

As is shown in FIG. 4, the terminal NHF is to this end connected to the high voltage terminal A of the voltage transformer 20, the test voltage being applied between these two terminals and earth. Otherwise, the connection is similar to the test arrangement shown in FIG. 3. The voltage applied to the primary side of the voltage transformer is preferably so adjusted that the voltage at the secondary winding 1a-1n corresponds to the voltage measured with the measuring arrangement of FIG. 3. As the result of this measurement, the transformation of the inductive voltage transformer, that is to say without the capacitive voltage divider C1, C2, is determined in the form of the ratio of the voltage on the primary side of the inductive transformer to the voltage at the secondary terminals 1a-1n.

This measurement is preferably also carried out only once for the first secondary winding 1a-1n. If this measurement is carried out for an inductive voltage transformer, the measurement result would correspond directly to the transformation ratio of the inductive voltage transformer under open-circuit conditions.

Finally, it is also possible to calculate from the measurement result obtained according to FIG. 3 and FIG. 4 the transformation ratio of the capacitive voltage divider C1, C2 of the voltage transformer 20, by dividing the voltage between the terminals A and NHF of the voltage transformer 20 obtained from the measurement of FIG. 3 by the voltage on the primary side of the transformer with short-circuited terminals A-NHF obtained from the measurement of FIG. 4.

The above-described measurements are carried out by the test device 10 in order, on the basis of the information so obtained, ultimately to be able to determine the accuracy of the tested voltage transformer 20.

Figure 5:
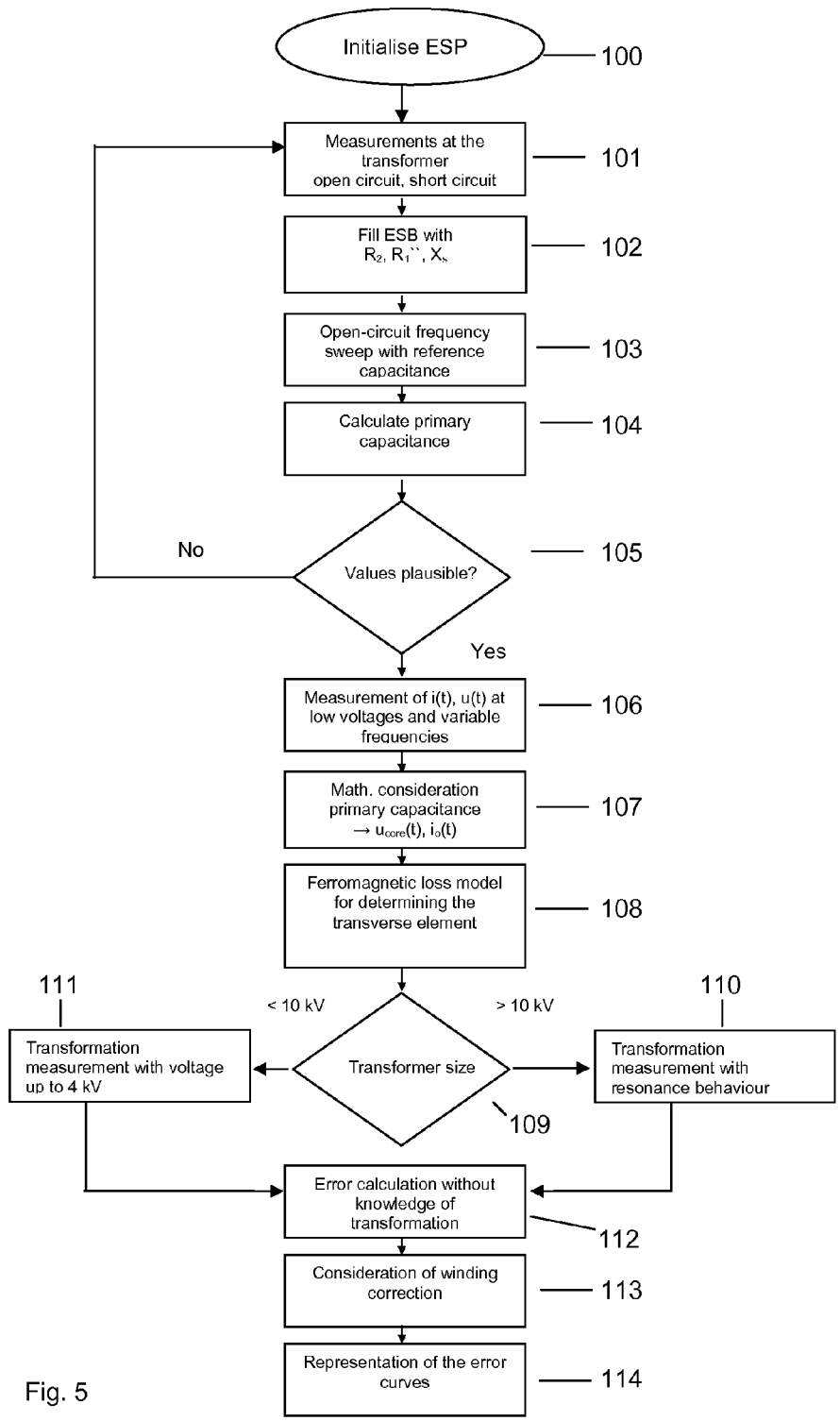
FIG. 5 shows a flow diagram for explaining the execution of a method for testing the accuracy of transformers according to an embodiment of the invention.

FIG. 5 shows, in the form of a flow diagram, a possible sequence of the method for determining the accuracy class of inductive voltage transformers according to an embodiment of the present invention, which method takes place automatically under the control of the control unit 14. Points that are additionally to be taken into consideration when this method is applied to capacitively coupled voltage transformers will be discussed separately hereinbelow.

The basis of this method is the already described transformer equivalent circuit (ESB), which can be related to the secondary side of the voltage transformer to be tested (step 100). A measurement on the secondary side thus ensures direct correspondence to the equivalent circuit. The concentrated capacitance integrated in the equivalent circuit represents the internal capacitance that is to be taken into consideration for the frequencies of up to 50 Hz or 60 Hz that are of relevance here (in some types of transformer, the internal capacitance is negligible). A further property of this method is the fact that the transverse element, which consists of the main inductance $X_m$ and the loss resistance $R_c$, can initially be assumed to be unknown.

In order to determine the elements of the equivalent circuit, the above-described open-circuit and short-circuit test is carried out (step 101) in order to provide the equivalent circuit with the information so obtained (step 102).

By means of a frequency sweep with a reference capacitance connected (step 103), the value of the primary internal capacitance Cp can then be determined (step 104). Steps 103 and 104 for determining the primary internal capacitance Cp are preferably carried out only if the primary internal capacitance is relatively high and the influence of the primary internal capacitance must therefore be taken into consideration.

If the values obtained are not plausible (step 105), the measurements, and consequently steps 101-105, are repeated.

If, on the other hand, the values are plausible, then the magnetisation behaviour of the voltage transformer can be measured from the secondary side. To that end, for every conceivable operating condition of the duty cycle, both the current i(t) and the voltage u(t) are measured in a time-resolved manner (step 106), only voltages of up to 10 V preferably being used. By varying the frequency with the same amplitude, the flux can be adjusted according to the specifications.

Following the measurement of the magnetisation behaviour, the influence of the already calculated primary internal capacitance is taken into consideration (step 107). The capacitive current is subtracted from the terminal current, so that only the current component responsible for the magnetisation of the core $i_0(t)$ and the voltage applied to the core $u_{core}(t)$ are taken into further consideration.

Because frequencies that are not equal to the operating frequency are used for the measurements, but the transformer core exhibits a strongly frequency-dependent behaviour, the measured values u(t) and i(t) are converted into values which are related to the operating condition. A comprehensive ferromagnetic loss interpretation and loss calculation model is used for that purpose (step 108), which model will be described independently hereinbelow with reference to FIG. 6. From the loss interpretation model, the current and voltage values are finally transformed into network elements. The simulated values of the magnetisation curve (current-voltage characteristic curve) at operating frequency as well as the angle information at different voltages are returned. For any desired burden and operating voltage, it is then possible to calculate the related voltage deviation and phase displacement, or phase error, of the transformer on the basis of the voltage vector diagram.

In order to calculate the actual accuracy under operating conditions from this equivalent-circuit-"related accuracy" of the voltage transformer, the open-circuit transformation of the voltage transformer is to be measured very accurately, as described. This generally differs from the nominal transformation because, on the one hand, the burden-dependent voltage drop over the secondary impedance of the voltage transformer, as well as any winding adjustment carried out during production, must be taken into consideration. Consideration of the winding adjustment is here referred to as "winding correction". The winding correction can take place by two different variants, depending on the physical design of the voltage transformer (step 109). On the one hand, a high voltage can be applied, as described, to the primary side of the voltage transformer (step 111). The measurement on the secondary side then allows the winding correction to the measured for the explicit voltage. A second and universal solution for taking account of this winding correction is provided by a resonance measurement on the secondary side in conjunction with the values of the internal capacitance and leakage inductance already calculated previously (step 110). The voltage values given in FIG. 5 are intended only as examples.

The measurement deviation initially calculated without knowledge of the actual transformation of the voltage transformer (step 112) can then be corrected by taking the winding correction into consideration (step 113), so that error curves for the measurement deviation in terms of amount and phase, related to the operating condition, are finally outputted (step 114).

A method for determining the main inductance and the loss resistance of the equivalent circuit using the already mentioned ferromagnetic loss model (see step 108 in FIG. 5) according to an embodiment of the invention will be described hereinbelow.

Voltage transformers have a significant frequency- and polarisation-dependent loss behaviour due to the core materials used. According to the modulation of the core plates, this behaviour is more or less non-linear. According to the induction rate and induction amplitude, a field-strength-dependent arrangement of the domain structure and thus a field-strength-dependent polarisation, or flux density, is established, which is accompanied by a non-linear loss dissipation in the form of Joule heating. Accordingly, if a measuring signal having a frequency that differs from the operating frequency is used, it is recommended to compensate for the frequency-dependent loss dissipation by means of a model.

To that end there can be used a simulation model of the frequency- and flux-dependent iron losses of the transformer, which reduces conventional empirical-analytical loss models by the flux density dependence to $P_{tot}=C \cdot f^x \cdot \Psi^y$, here C, $f^x$ and $\Psi^y$ describe the components dependent on the transformer as well as on the frequency f and the flux $\Psi$. In order to permit this simplification, measurements are carried out with different frequencies in each case for the same linked flux. Finally, using a model-based method, the dynamic coefficient C and the exponent x of the frequency f and the exponent y for the flux $\Psi$ can be determined. For operating the simulation model, measurements are preferably carried out at low voltages less than 10 V and variable frequency between 0 and 50 Hz.

Figure 6:
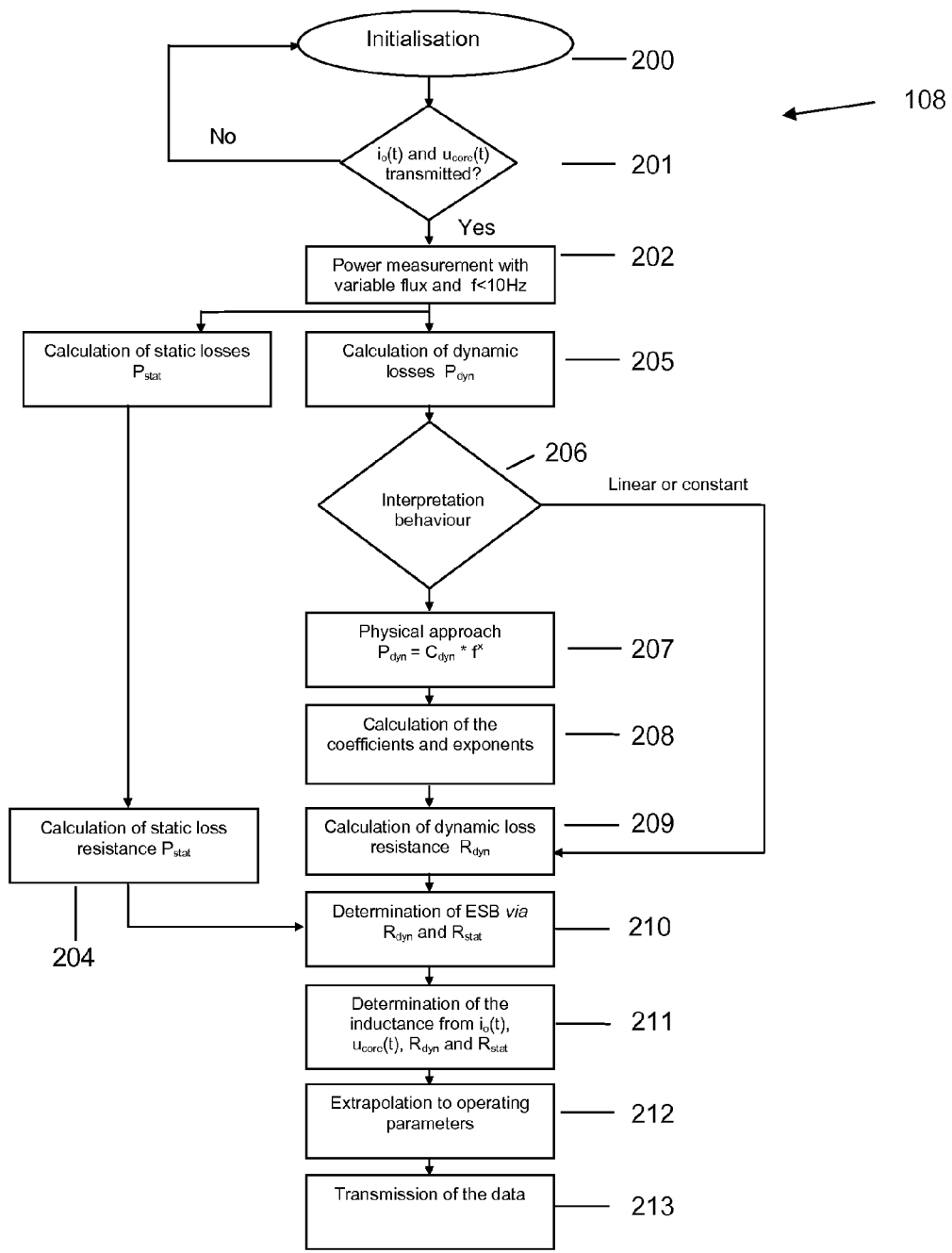
FIG. 6 shows a flow diagram for determining the main inductance and the loss resistance of the equivalent circuit shown in FIG. 1 using a ferromagnetic loss model according to an embodiment of the invention.

FIG. 6 shows a flow diagram for determining the main inductance and the loss resistance of the equivalent circuit shown in FIG. 1 using such a ferromagnetic loss model or simulation model according to an embodiment of the invention.

At the beginning of the method (step 200), the current values $i_0(t)$ already corrected by the capacitive current by the primary coil capacitance, and the associated voltage values $u_{core}(t)$ are delivered to the loss model (step 201). There follow low-frequency power measurements at the flux densities conventional for operation (step 202). The low measuring frequency is associated with the requirement of small voltage amplitudes.

The losses $P_{tot}$ that occur in the case of the power measurements are separated using a loss separation approach into static losses $P_{stat}$ and dynamic losses $P_{dyn}$. The static losses $P_{stat}$ increase linearly with the frequency (step 203). The static loss resistance $R_{stat}$ for the network model can be calculated directly from the static component (step 204).

The dynamic behaviour of the loss dissipation with the frequency is then interpreted (step 206). According to the type of transformer, this can be constant, linear or non-linear over the frequency. For one of the first two cases, the dynamic loss resistance $R_{dyn}$ can be calculated directly. Because in the non-linear case the loss dissipation follows the approach $P_{dyn}=C_{dyn} \cdot f^x$, the coefficient $C_{dyn}$ and the exponent x of the power function must in this case first be determined by a specific method (step 208). Accordingly, the dynamic loss resistance $R_{dyn}$ can also be converted into a network element in the case of a non-linear dissipation for physical reasons (steps 209 and 210). Comprehensive measurements of the loss dissipation in the laboratory form the bases for this approach.

The development of the main inductance over time (hysteresis curve) can be determined from the difference between the total magnetisation current and the ohmic currents by the calculated resistances $R_{dyn}$ and $R_{stat}$ (step 211).

Finally, the magnetisation current/voltage characteristic curve as well as the information regarding the phase angle of the main impedance at different core voltages is converted by the model into corresponding information at operating frequency or under the operating condition (step 212) and delivered as data for further processing by the method shown in FIG. 5.

Figure 7:
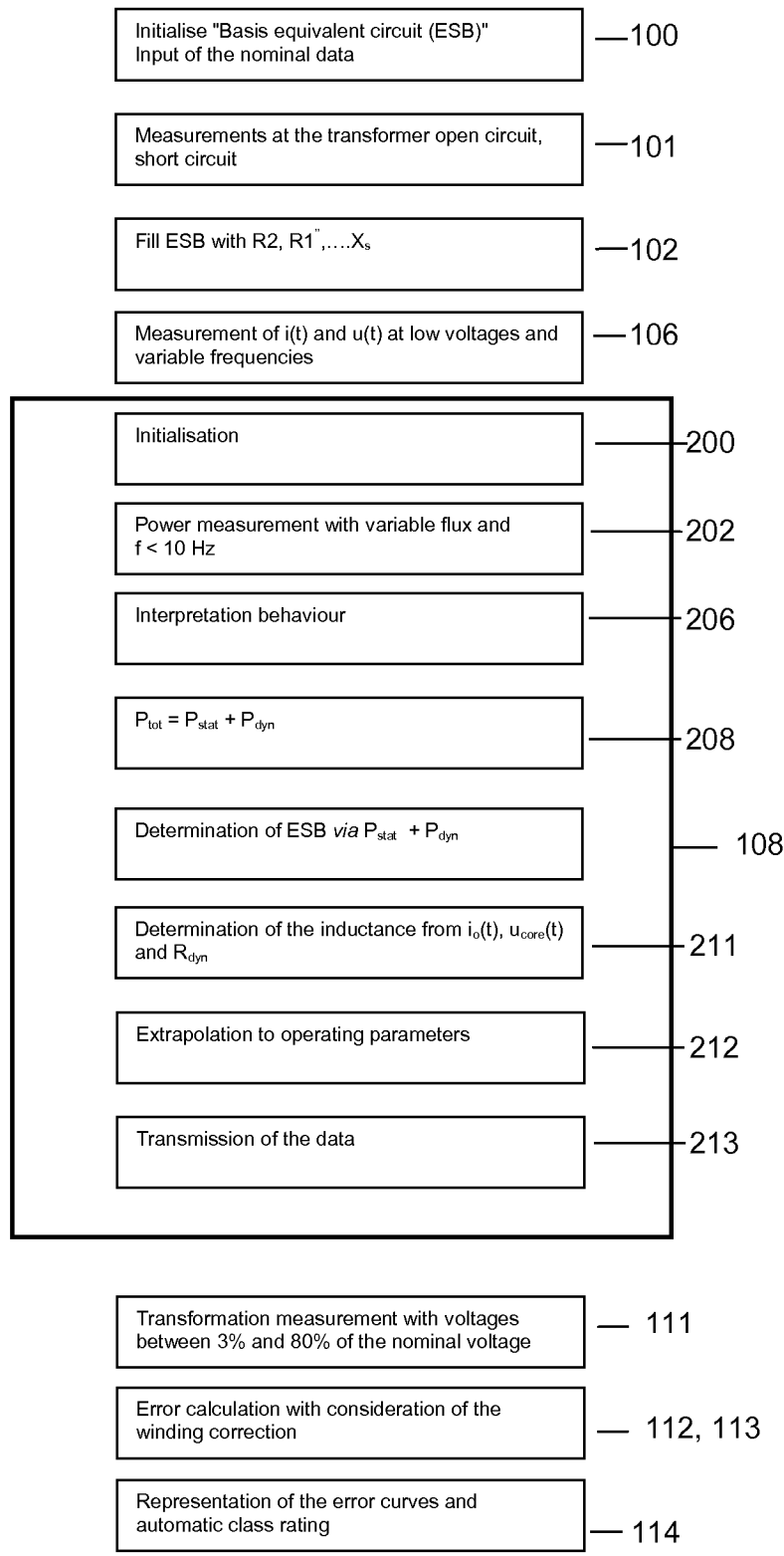
FIG. 7 shows a flow diagram for determining the main inductance and the loss resistance of the equivalent circuit shown in FIG. 1 using a ferromagnetic loss model according to a further embodiment of the invention.

FIG. 7 shows a flow diagram of an alternative method to FIG. 5 and FIG. 6 using a ferromagnetic loss model or simulation model according to a further embodiment of the invention, wherein in this embodiment the primary internal capacitance Cp is not determined. In FIG. 7, the steps corresponding to the steps shown in FIG. 5 and FIG. 6 have been given the same reference numerals, so that reference can be made in this connection to the preceding description of those steps.

The method shown in FIG. 7 differs from the methods shown in FIG. 5 and FIG. 6 substantially, on the one hand, in that the steps relating to the determination and consideration of the primary internal capacitance Cp are omitted, and, on the other hand, by the alternative configuration or formulation of the ferromagnetic loss model 108.

After step 206, the losses $P_{tot}$ occurring in the case of the power measurements are again separated by a loss separation approach into static losses $P_{stat}$ and dynamic losses $P_{dyn}$, in order to determine the elements of the equivalent circuit on that basis. In step 211, the mutual inductance is calculated from $i_0(t)$, $u_{core}(t)$ and the dynamic resistance $R_{dyn}$ (also referred to as $R_{eddy}$).

As shown in FIG. 7, the transformation measurement in step 111 is preferably carried out with voltages in the range of from 3% to 80% of the nominal voltage of the object under test.

The loss interpretation models described above with reference to FIG. 6 and FIG. 7 are intended only as examples, it being possible for other models also to be used. Because the measurements described in connection with FIG. 5 are preferably carried out using voltages and frequencies that are significantly below the corresponding nominal values of the voltage transformer that is to be tested, the model used primarily serves the purpose of converting the measured data that deviate from the nominal values into data that are related to the nominal values. On the one hand, the magnetisation curve of the voltage transformer is to be detected, whereby the core of the voltage transformer is preferably driven into saturation from the secondary side by application of a suitable voltage below the nominal frequency. On the other hand, the frequency-dependent losses of the voltage transformer are to be detected so that they can be converted to the nominal values again using the correct factors. How the relevant parameters are measured and converted depends on the model that is used in a particular case.

Some transformer types have a connected damping unit. This damping unit can also be taken into consideration when determining the accuracy of the transformer, in order to improve the meaningfulness of the test of the accuracy of the transformer.

The invention claimed is:

1. Method for testing a transformer, comprising the steps
a) emulating the transformer by means of an equivalent circuit,
b) applying a test signal to the transformer,
c) detecting a test response of the transformer in dependence on the test signal,
d) automatically determining an equivalent-circuit-related accuracy of the transformer on the basis of the test response, and
e) automatically determining an operating-condition-related accuracy of the transformer from the equivalent-circuit-related accuracy.

2. Method according to claim 1, wherein in steps c) and d), components of the equivalent circuit are determined automatically in dependence on the test response of the transformer in order to determine the equivalent-circuit-related accuracy of the transformer on the basis of the equivalent circuit thus provided with specific values for the components.

3. Method according to claim 1, wherein in step d), an equivalent-circuit-related voltage deviation and/or an equivalent-circuit-related phase displacement of the transformer are determined for different burdens, operating voltages and/or operating frequencies of the transformer, and are converted in step e) into a corresponding voltage deviation or a corresponding phase displacement for corresponding operating conditions of the transformer.

4. Method according to claim 1, wherein in step e), the equivalent-circuit-related accuracy of the transformer is converted into the operating-condition-related accuracy of the transformer using a simulation model of the transformer, wherein the simulation model takes into consideration frequency-dependent and flux-dependent iron losses of the transformer.

5. Method according to claim 1, wherein for determining the equivalent-circuit-related accuracy of the transformer, a test signal with a voltage of not more than 10 V and/or a frequency of not more than 10 Hz is applied.

6. Method according to claim 1, wherein for determining the equivalent-circuit-related accuracy of the transformer, a test signal with a voltage less than the nominal voltage of the transformer and a frequency less than the nominal frequency of the transformer is applied.

7. Method according to claim 1, wherein in steps b) to d), a primary winding resistance and a secondary winding resistance of the equivalent circuit are determined by means of a resistance measurement on the transformer.

8. Method according to claim 7, wherein a resistance measurement is carried out at each secondary winding of the transformer in order to determine the corresponding secondary winding resistance for each secondary winding, wherein a transformed primary winding resistance of the equivalent circuit is determined automatically from the determined secondary winding resistances and from measured stray losses of the transformer.

9. Method according to claim 1, wherein in steps b) to d), stray losses of the transformer are determined automatically by a short-circuit impedance measurement.

10. Method according to claim 9, wherein for determining the stray losses of the transformer, the primary side is short circuited and a test signal is applied to each secondary winding of the transformer in succession.

11. Method according to claim 1, wherein in steps b) to d), leakage inductances of the equivalent circuit of the transformer are determined automatically by short-circuit impedance measurements on the primary side and on the secondary side.

12. Method according to claim 1, wherein in steps b) to d), a measurement of the magnetisation behaviour of the transformer is carried out by applying test signals with different voltages and frequencies.

13. Method according to claim 1, wherein in steps b) to d), the transformation ratio of the transformer is determined.

14. Method according to claim 13, wherein for determining the transformation ratio, a test signal with a voltage in the range of from 3% to 80% of the nominal voltage of the transformer is applied to the transformer on the primary side.

15. Method according to claim 13, wherein a measurement of a total transformation ratio of the transformer, a measurement of a transformation ratio of an inductive voltage transformer of the transformer and a measurement of a transformation ratio of a capacitive voltage divider of the transformer are carried out.

16. Method according to claim 1, wherein when determining the accuracy of the transformer, a winding adjustment carried out during the manufacture of the transformer is automatically taken into consideration.

17. Method according to claim 16, wherein the winding adjustment is taken into consideration when determining the transformation ratio of the transformer in steps b) to d).

18. Method according to claim 1, wherein the test response is detected using a four-wire measuring method.

19. Method according to claim 1, wherein the method is carried out for a transformer in the form of an inductive voltage transformer or for a transformer in the form of a capacitive voltage transformer.

20. Method according to claim 1, wherein the method is carried out by means of a portable test device at the installation site of the transformer.

21. Device for testing a transformer, comprising
 a test signal source generating a test signal which is to be applied to the transformer,
 a test response detection device having a measuring input to connect to the transformer to detect a test response of the transformer in dependence on the test signal, and
 a control unit coupled to the test response detection device to receive the test response of the transformer, the control unit emulating the transformer by determining components of an equivalent circuit of the transformer, on the basis of the test response, automatically determining an equivalent-circuit-related accuracy of the transformer, and converting that accuracy into an operating-condition-related accuracy of the transformer.

22. Device according to claim 21, wherein the device is in the form of a portable test device for carrying out an in situ test of the transformer.

23. Device according to claim 21, wherein the device is configured for testing a transformer in the form of a voltage transformer.

* * * * *